(12) United States Patent
Otsubo

(10) Patent No.: US 10,575,399 B2
(45) Date of Patent: Feb. 25, 2020

(54) MULTILAYER SUBSTRATE

(71) Applicant: Murata Manufacturing Co., Ltd., Nagaokakyo-shi, Kyoto-fu (JP)

(72) Inventor: Yoshihito Otsubo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 21 days.

(21) Appl. No.: 15/010,264

(22) Filed: Jan. 29, 2016

(65) Prior Publication Data
US 2016/0150636 A1 May 26, 2016

Related U.S. Application Data

(63) Continuation of application No. PCT/JP2014/070903, filed on Aug. 7, 2014.

(30) Foreign Application Priority Data

Sep. 6, 2013 (JP) ................. 2013-184810

(51) Int. Cl.
*H05K 1/02* (2006.01)
*H05K 1/03* (2006.01)
*H05K 3/46* (2006.01)

(52) U.S. Cl.
CPC ........... *H05K 1/028* (2013.01); *H05K 1/0283* (2013.01); *H05K 1/0326* (2013.01);
(Continued)

(58) Field of Classification Search
CPC .... H05K 1/028; H05K 1/0283; H05K 1/0277; H05K 1/0278; H05K 1/147;
(Continued)

(56) References Cited

U.S. PATENT DOCUMENTS 5,445,869 A * 8/1995 Ishikawa ................ H05K 1/028
428/209
6,936,950 B2 * 8/2005 Akagawa .............. B81B 3/0037
310/309
(Continued)

FOREIGN PATENT DOCUMENTS

DE 44 12 278 A1 10/1995
DE 4412278 A1 * 10/1995 ........... H05K 1/0278
(Continued)

OTHER PUBLICATIONS

Official Communication issued in International Patent Application No. PCT/JP2014/070903, dated Oct. 28, 2014.
(Continued)

*Primary Examiner* — Steven T Sawyer
*Assistant Examiner* — Paresh H Paghadal
(74) *Attorney, Agent, or Firm* — Keating & Bennett, LLP

(57) ABSTRACT

A multilayer substrate includes a multilayer body including a plurality of stacked resin layers and a wiring layer provided in the resin layer. The multilayer body includes a deformable flexible portion which generally defines a wave-shaped portion extending in a direction of travel that is repeatedly changed when viewed in a direction of stacking of the resin layers, the wiring layer being routed along the wave-shaped portion. The flexible portion includes a turn-back portion arranged at a position where the direction of travel is changed and an intermediate portion connecting adjacent turn-back portions to each other. A width of the turn-back portion is greater than a width of the intermediate portion.

8 Claims, 7 Drawing Sheets

(52) U.S. Cl.
CPC ......... *H05K 1/0333* (2013.01); *H05K 1/0346* (2013.01); *H05K 1/0278* (2013.01); *H05K 3/4691* (2013.01); *H05K 2201/0129* (2013.01); *H05K 2201/0141* (2013.01); *H05K 2201/0154* (2013.01); *H05K 2201/055* (2013.01); *H05K 2201/097* (2013.01); *H05K 2201/09063* (2013.01); *H05K 2201/09263* (2013.01); *H05K 2201/09727* (2013.01)

(58) Field of Classification Search
CPC .......... H05K 3/4691; H05K 2201/055; H05K 2201/056; H05K 2201/09263; H05K 2201/09272
See application file for complete search history.

(56) References Cited

U.S. PATENT DOCUMENTS

| | | | | |
|---|---|---|---|---|
| 7,832,272 | B2* | 11/2010 | Fujimoto | H03H 9/21 73/504.12 |
| 8,508,826 | B2* | 8/2013 | Terada | H01L 41/0953 359/221.1 |
| 2003/0221861 | A1* | 12/2003 | Dupriest | H01R 4/04 174/117 F |
| 2005/0237725 | A1 | 10/2005 | Cho et al. | |
| 2006/0244177 | A1* | 11/2006 | Kaneto | A61B 5/03 264/248 |
| 2009/0102580 | A1* | 4/2009 | Uchaykin | H01P 1/2039 333/185 |
| 2009/0126976 | A1* | 5/2009 | Iida | H05K 1/028 174/254 |
| 2009/0133497 | A1* | 5/2009 | Fujimoto | G01C 19/5621 73/504.12 |
| 2012/0075038 | A1* | 3/2012 | Kaizaki | H01L 23/49827 333/204 |
| 2013/0341173 | A1* | 12/2013 | Stone | H01H 13/79 200/512 |
| 2014/0021262 | A1* | 1/2014 | Matsumura | G06K 19/07749 235/488 |
| 2015/0065840 | A1* | 3/2015 | Bailey | A61B 5/6802 600/384 |
| 2015/0296607 | A1* | 10/2015 | Yang | G01L 1/205 361/750 |
| 2015/0354797 | A1* | 12/2015 | Luo | H05K 1/028 362/223 |

FOREIGN PATENT DOCUMENTS

| | | |
|---|---|---|
| JP | 06-216475 A | 8/1994 |
| JP | 10-256694 A | 9/1998 |
| JP | 2001-053988 A | 2/2001 |
| JP | 2005-311376 A | 11/2005 |
| JP | 2007-103695 A | 4/2007 |
| JP | 2011-249637 A | 12/2011 |

OTHER PUBLICATIONS

Official Communication issued in Japanese Patent Application No. 2015-535398, dated Dec. 1, 2015.

* cited by examiner

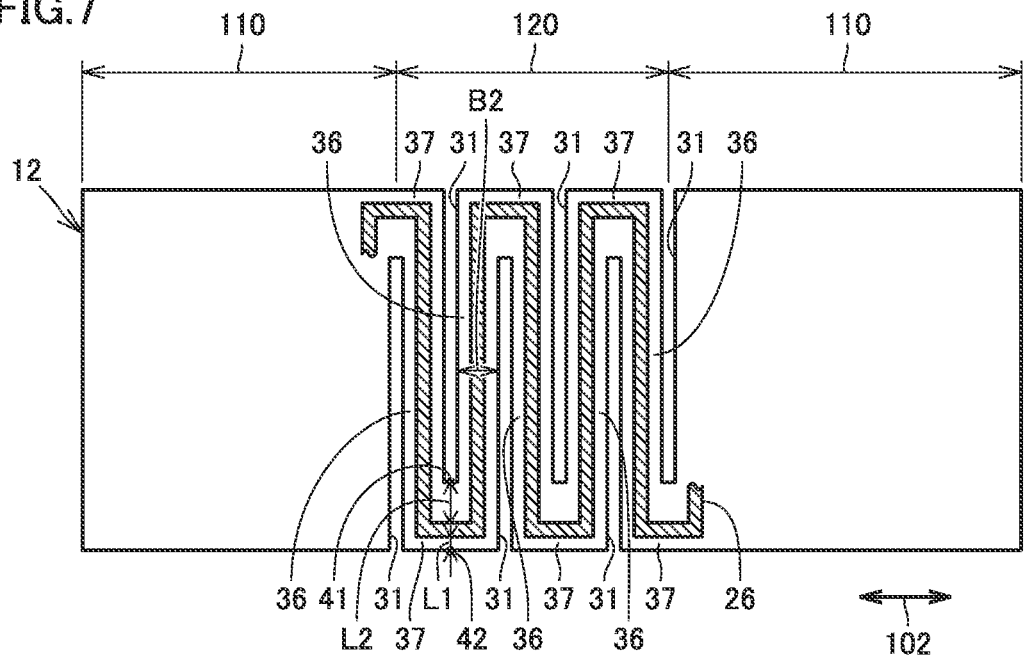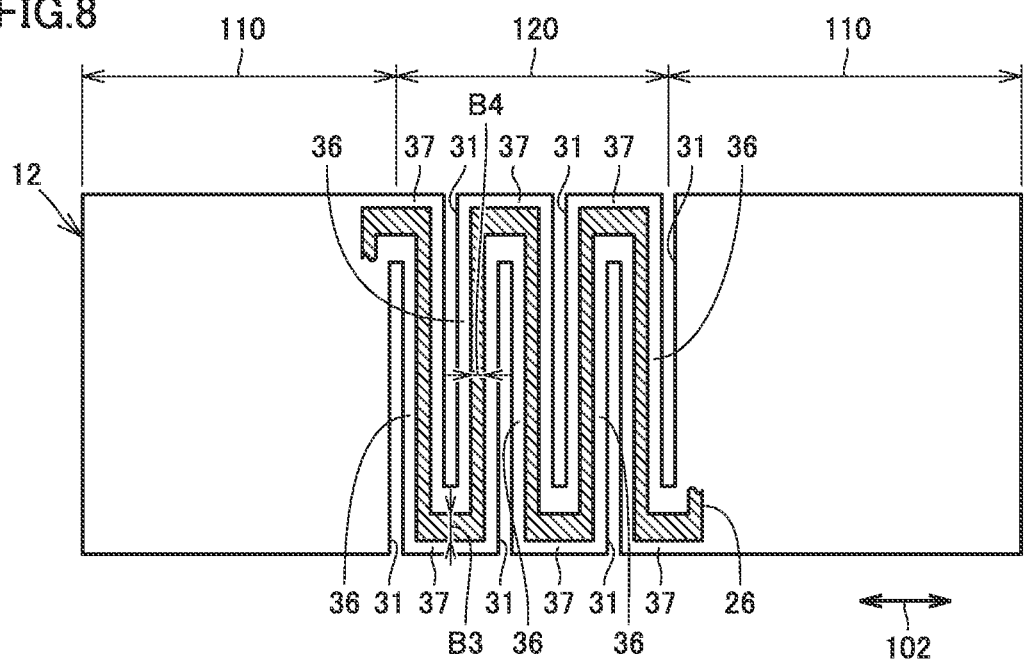

MULTILAYER SUBSTRATE

BACKGROUND OF THE INVENTION

1. Field of the Invention

The present invention generally relates to a multilayer substrate and more particularly to a multilayer substrate in which a deformable flexible portion is provided in a multilayer body including a plurality of stacked resin layers and a wiring layer provided in the resin layer.

2. Description of the Related Art

As a conventional multilayer substrate, for example, Japanese Patent Laying-Open No. 2005-311376 discloses a flexible printed circuit board aiming to achieve high reliability even under repeated twisting. The flexible printed circuit board disclosed in Japanese Patent Laying-Open No. 2005-311376 has a bent portion which is straightened out at the time of twisting. The bent portion is formed such that surfaces at opposite edges each have a wave-shape projected-and-recessed pattern extending in a longitudinal direction of a small-thickness board of the flexible printed circuit board.

As disclosed in Japanese Patent Laying-Open No. 2005-311376, a multilayer substrate provided with a flexible (deformable) portion is included in an electric appliance such as a foldable portable telephone. In such a multilayer substrate, with deformation, stress tends to concentrate in a specific portion of the flexible portion, and durability of the flexible portion is compromised. In this case, there is a possibility of breakage of the flexible portion or disconnection of a wiring layer routed in the flexible portion. Such a possibility may also adversely affect electrical characteristics of an electric appliance including the multilayer substrate.

SUMMARY OF THE INVENTION

Preferred embodiments of the present invention provide a multilayer substrate having improved durability of a flexible portion.

A multilayer substrate according to a preferred embodiment of the present invention includes a multilayer body including a plurality of stacked resin layers and a wiring layer provided in the resin layer. The multilayer body is provided with a deformable flexible portion generally defining a wave-shaped portion extending along a direction of travel that is repeatedly changed when viewed in a direction of stacking of the resin layers, the wiring layer being routed along the wave-shaped portion. The flexible portion includes a turn-back portion arranged at a position where the direction of travel is changed and an intermediate portion connecting adjacent turn-back portions to each other. The turn-back portion is greater in width than the intermediate portion.

According to the multilayer substrate thus constructed, durability of the flexible portion is significantly improved by relatively increasing a width of the turn-back portion where stress tends to concentrate with deformation of the flexible portion.

Preferably, the wiring layer is provided in the turn-back portion, at a position closer to an outer peripheral side relative to an inner peripheral side of the flexible portion generally defining the wave shape.

According to the multilayer substrate thus constructed, breakage of the wiring layer is prevented by arranging a wiring layer on the outer peripheral side, rather than on the inner peripheral side where stress is more likely to concentrate in the turn-back portion.

Preferably, a cross-sectional area of the wiring layer in the turn-back portion is greater than a cross-sectional area thereof in the intermediate portion. Further preferably, the wiring layer is provided such that a width thereof in the turn-back portion is greater than a width thereof in the intermediate portion.

According to the multilayer substrate thus constructed, breakage of the wiring layer is prevented by relatively increasing a cross-sectional area of the wiring layer in the turn-back portion where stress tends to concentrate with deformation of the flexible portion.

Preferably, a centerline of the flexible portion extending along the direction of travel defines has a wave-shape such that an antinode is located in the turn-back portion. A length of the turn-back portion in a direction perpendicular or substantially perpendicular to the centerline in the antinode is greater than a length of the intermediate portion in the direction perpendicular or substantially perpendicular to the centerline.

The "antinode" means a portion where a wave-shaped centerline has a peak shape in a direction of amplitude.

According to the multilayer substrate thus constructed, durability of the flexible portion is greatly improved.

Preferably, the flexible portion extends in a direction of travel that is repeatedly changed by 180° so as to generally define a meandering shape portion. The multilayer body is provided with a slit which passes through in the direction of stacking of the resin layers and extends toward the turn-back portion along the direction of travel of the intermediate portion when viewed in the direction of stacking of the resin layers. The turn-back portion on an extension from the slit is greater in length than the intermediate portion between the slits.

According to the multilayer substrate thus constructed, durability of the flexible portion generally defining a meandering shape portion is greatly improved.

Further preferably, when an inner peripheral edge of the turn-back portion is defined at an end portion of the slit extending toward the turn-back portion and an outer peripheral edge of the turn-back portion is defined at an end portion of the turn-back portion on the extension from the slit that opposes the inner peripheral edge, the wiring layer is arranged such that a length between the outer peripheral edge and the wiring layer is smaller than a length between the inner peripheral edge and the wiring layer in the turn-back portion.

According to the multilayer substrate thus constructed, breakage of the wiring layer routed in the flexible portion generally defining a meandering shape portion is prevented.

As described above, according to various preferred embodiments of the present invention, a multilayer substrate having improved durability of a flexible portion is provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7 is a cross-sectional view showing a first modification of the multilayer substrate in FIG. 6.

FIG. 8 is a cross-sectional view showing a second modification of the multilayer substrate in FIG. 6.

DETAILED DESCRIPTION OF THE PREFERRED EMBODIMENTS

Figure 1:
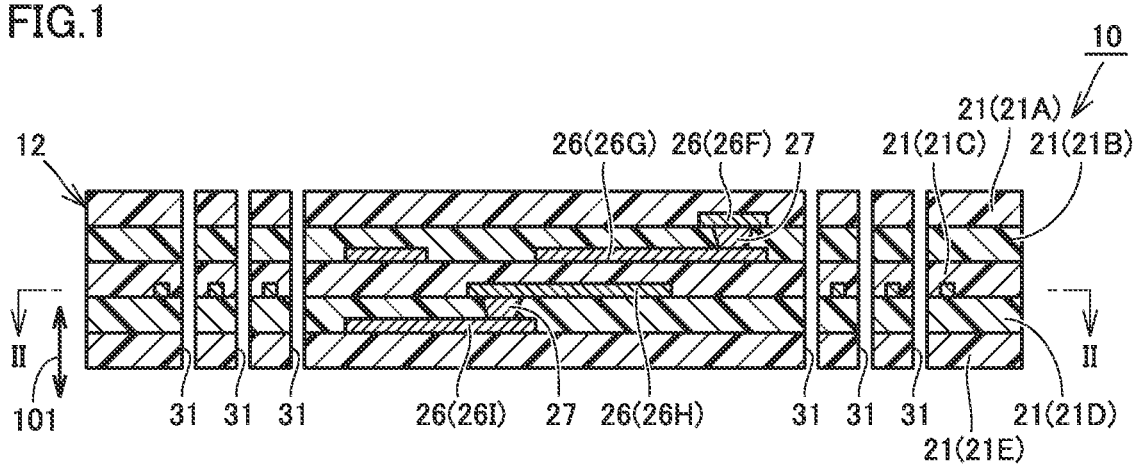
FIG. 1 is a cross-sectional view showing a multilayer substrate according to a first preferred embodiment of the present invention.

Preferred embodiments of the present invention will be described with reference to the drawings. In the drawings referred to below, the same or corresponding members have the same reference characters assigned thereto.

First Preferred Embodiment

Figure 2:
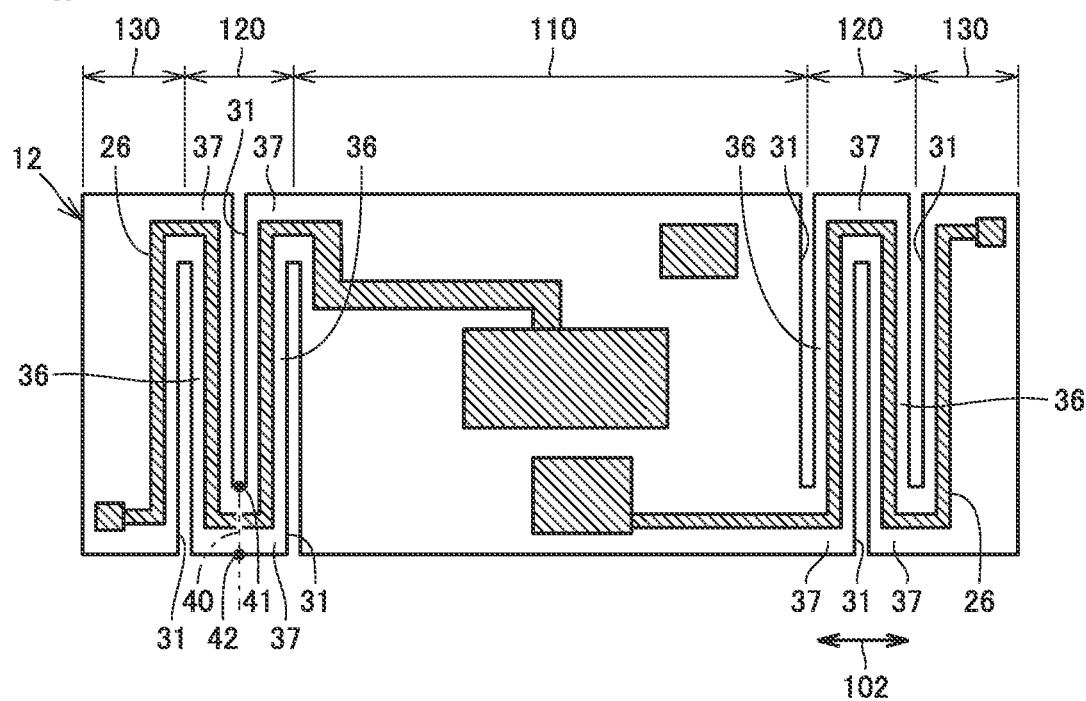
FIG. 2 is a cross-sectional view showing the multilayer substrate along the line II-II in FIG. 1.

FIG. 1 is a cross-sectional view showing a multilayer substrate according to a first preferred embodiment of the present invention. FIG. 2 is a cross-sectional view showing the multilayer substrate along the line II-II in FIG. 1.

A general structure of a multilayer substrate 10 in the present preferred embodiment will initially be described with reference to FIGS. 1 and 2. The multilayer substrate 10 includes a multilayer body 12 including a plurality of resin layers 21A, 21B, 21C, 21D, and 21E (hereinafter referred to as a resin layer 21 when they are not particularly distinguished from one another), a plurality of wiring layers 26F, 26G, 26H, and 26I (hereinafter referred to as a wiring layer 26 when they are not particularly distinguished from one another), and an inner via 27.

The resin layer 21 is preferably made of a thermoplastic resin. This thermoplastic resin includes, for example, polyimide, liquid crystal polymer (LCP), polyether ether ketone (PEEK), and polyphenylene sulfide (PPS). A plurality of resin layers 21 are stacked in a direction shown with an arrow 101 in FIG. 1 (hereinafter the direction shown with arrow 101 is referred to as a direction of stacking of the resin layers 21). The resin layer 21A, the resin layer 21B, the resin layer 21C, the resin layer 21D, and the resin layer 21E are aligned from top to bottom in the given order. The plurality of stacked resin layers 21 exhibit the appearance of the multilayer body 12.

The wiring layer 26 is preferably defined by a metal film such as a metal foil, which is composed of a metal such as copper, silver, aluminum, stainless steel, nickel, or gold, or an alloy containing such a metal. The wiring layer 26 is provided within the multilayer body 12. The wiring layer 26 is arranged between the plurality of resin layers 21. More specifically, the wiring layer 26F is arranged between the resin layer 21A and the resin layer 21B, the wiring layer 26G is arranged between the resin layer 21B and the resin layer 21C, the wiring layer 26H is arranged between the resin layer 21C and the resin layer 21D, and the wiring layer 26I is arranged between the resin layer 21D and the resin layer 21E.

The wiring layer 26 preferably has a shape of a prescribed pattern, and defines various electric circuits such as a stripline or a micro-stripline, a coil, and a capacitor, for example.

The inner via 27 is preferably made of a conductive material. Specifically, the inner via 27 is made of a sintered conductive paste. The inner via 27 is provided within the multilayer body 12. The inner via 27 extends in the direction of stacking of the resin layers 21 and connects the wiring layers 26 provided in different layers to each other.

Though the figures show an example in which the multilayer body 12 preferably has a rectangular or substantially rectangular two-dimensional shape when viewed in the direction of stacking of the resin layers 21, the multilayer body 12 may have a two-dimensional shape in any shape other than the rectangle. Though the figures show the wiring layer 26 only provided within the multilayer body 12, the wiring layer 26 may be provided also on a surface of the multilayer body 12.

The multilayer body 12 is provided with a main body portion 110, a flexible portion 120, and a pad portion 130. In the present preferred embodiment, the flexible portion 120 and the pad portion 130 are arranged in the given order, on each of opposing sides of the main body portion 110, with the main body portion 110 lying therebetween.

The main body portion 110 is a rigid portion which is less likely to deform than the flexible portion 120. Various electronic components may be mounted on a surface of the main body portion 110. The flexible portion 120 is a deformable flexible portion. When the multilayer body 12 is viewed two-dimensionally, the flexible portion 120 extends from a peripheral edge of the main body portion 110. The pad portion 130 is provided at a tip end of the flexible portion 120 extending from the main body portion 110. The pad portion 130 may be provided with a connector to connect a wire provided in the multilayer body 12 and an external circuit to each other.

In the present preferred embodiment, the flexible portion 120 is deformable in both of the direction of stacking of the resin layers 21 (the direction shown with arrow 101 in FIG. 1) and a direction of connection between the main body portion 110 and the pad portion 130 (a direction shown with an arrow 102 in FIG. 2 and a direction of extension and contraction). Such flexibility of the flexible portion 120 allows mounting of the multilayer substrate 10 on a site where there is a height difference between the main body portion 110 and the pad portion 130 and a site where a distance between the main body portion 110 and the pad portion 130 varies. The multilayer substrate 10 can also be mounted on a site where variation in height or variation in length of mounting occurs.

In order to increase flexibility of the flexible portion 120, the flexible portion 120 may have fewer resin layers 21 than the main body portion 110.

The wiring layer 26 is routed in the flexible portion 120. The wiring layer 26 extends linearly from the main body portion 110 toward the pad portion 130 in the flexible portion 120. In the present preferred embodiment, the wiring layer 26 is superimposed on a centerline 106 of the flexible portion 120 which will be described later. The flexible portion 120 may have a stripline or a micro-stripline wiring structure.

A plurality of slits 31p, 31q, and 31r (see FIG. 3) (hereinafter referred to as a slit 31 when they are not particularly distinguished from one another) to define the deformable flexible portion 120 are provided in the multilayer body 12.

Figure 3:
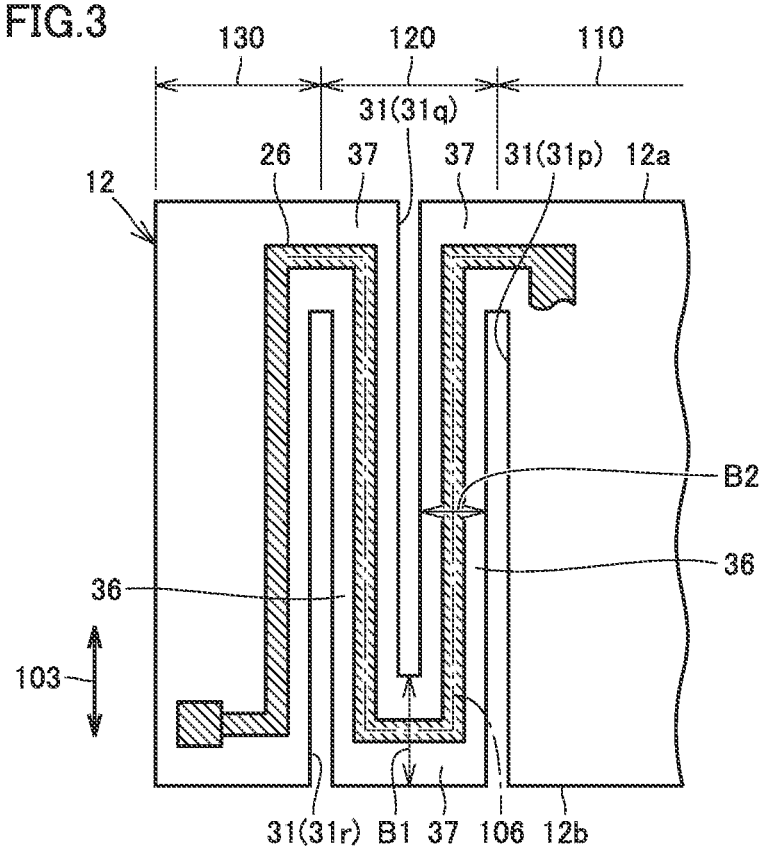
FIG. 3 is a cross-sectional view showing the multilayer substrate in an enlarged manner, with the flexible portion in FIG. 2 being centered.

In succession, a structure of the flexible portion 120 provided in the multilayer substrate 10 will be described in detail. FIG. 3 is a cross-sectional view showing the multilayer substrate in an enlarged manner, with the flexible portion in FIG. 2 being centered.

Referring to FIGS. 1 to 3, the flexible portion 120 generally defines a wave-shaped portion extending along a direction of travel that is repeatedly changed when viewed in the direction of stacking of the resin layers 21. The flexible portion 120 preferably includes a turn-back portion 37 arranged at a position where the direction of travel is changed and an intermediate portion 36 connecting adjacent turn-back portions 37 to each other.

The turn-back portion 37 and the intermediate portion are alternately provided between the main body portion 110 and the pad portion 130. In the present preferred embodiment, the flexible portion 120 preferably includes three turn-back portions 37 and two intermediate portions 36, for example, and the turn-back portions 37 arranged at opposing ends thereof are connected to the main body portion 110 and the pad portion 130, respectively.

FIG. 3 shows the centerline 106 extending along the direction of travel of the flexible portion 120. The centerline 106 has a wave shape such that an antinode is located in the turn-back portion 37.

In the present preferred embodiment in particular, the flexible portion 120 generally has a meandering shape extending along a direction of travel that is repeatedly changed by 180° when viewed in the direction of stacking of the resin layers 21. The centerline 106 preferably has a rectangular or substantially rectangular wave shape.

The slit 31 provided in the multilayer body 12 passes through in the direction of stacking of the resin layers 21. When viewed in the direction of stacking of the resin layers 21, the slit 31 extends toward the turn-back portion 37 along the direction of travel of the intermediate portion 36. The slit 31 extends linearly. The plurality of slits 31 extend parallel or substantially in parallel to one another. The plurality of slits 31 are arranged at an interval from each other in a direction of connection between the main body portion 110 and the pad portion 130.

The slit 31$p$, the slit 31$q$, and the slit 31$r$ are aligned from a side of the main body portion 110 toward a side of the pad portion 130 in the given order. The multilayer body 12 includes an edge 12$a$ and an edge 12$b$ arranged as opposed to edge 12$a$. The slit 31$p$ extends linearly from the edge 12$b$ to a position before the edge 12$a$. The slit 31$q$ extends linearly from the edge 12$a$ to a position before the edge 12$b$. The slit 31$r$ extends linearly from the edge 12$b$ to a position before the edge 12$a$.

The turn-back portion 37 is provided at each of tip ends of the slits 31$p$, 31$q$, and 31$r$ which extend linearly. The intermediate portion 36 is provided between the slit 31$p$ and the slit 31$q$ and between the slit 31$q$ and the slit 31$r$.

The flexible portion 120 preferably has a meandering shape as the slit 31 extending from the edge 12$a$ to the position before the edge 12$b$ and the slit 31 extending from the edge 12$b$ to the position before the edge 12$a$ are alternately provided in the multilayer body 12.

In the multilayer substrate 10 in the present preferred embodiment, the flexible portion 120 is configured such that a width B1 of the turn-back portion 37 is greater than a width B2 of the intermediate portion 36.

More specifically, the width B1 of the turn-back portion 37 in a direction perpendicular or substantially perpendicular to the centerline 106 at a position of the antinode of the centerline 106 defining the wave-shaped portion is greater than the width B2 of the intermediate portion 36 in the direction perpendicular or substantially perpendicular to the centerline 106. The "antinode" of the centerline 106 refers to a portion where the centerline 106 having the shape of the rectangular wave has a peak shape in the direction of amplitude thereof (a direction shown with an arrow 103 in FIG. 3).

More specifically, the length B1 of the turn-back portion 37 on an extension 40 (see FIG. 2) from the slit 31 is greater than the length B2 of the intermediate portion 36 between adjacent slits 31 (B1>B2).

According to such a construction, since the turn-back portion 37 where a cleavage force acts with deformation of the flexible portion 120 and stress tends to concentrate is greater in width than the intermediate portion 36, durability of the flexible portion 120 is greatly improved. Thus, breakage of the flexible portion 120 is prevented and breakage of the wiring layer 26 routed in the flexible portion 120 is prevented.

The multilayer substrate 10 in the present preferred embodiment is manufactured, for example, through a manufacturing process described below. Initially, a resin sheet with a copper foil is prepared. Then, with a resist patterned in a prescribed shape being used as a mask, a portion of a copper foil is etched with acid (by way of example, HCl). Then, the resist is removed with alkali (by way of example, NaOH), and neutralization treatment is successively performed.

Then, a process for forming a hole with laser is performed onto a portion corresponding to the inner via 27. The formed hole is filled with a conductive paste. Then, a plurality of resin sheets which have gone through the process described above are layered over, and thermocompression-bonded to, one another, so that the multilayer body 12 is obtained. Finally, through laser machining, dicing, or punching, the slit 31 is formed in the multilayer body 12. A plurality of resin sheets each having a cut in advance in a shape of the slit 31 may be layered over one another.

Figure 4:
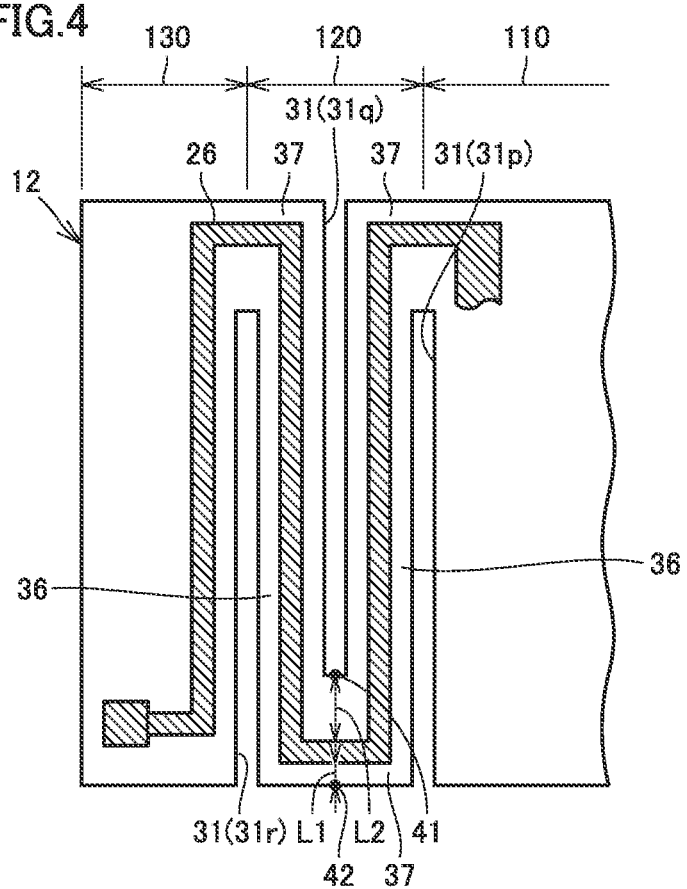
FIG. 4 is a cross-sectional view showing a first modification of the multilayer substrate in FIG. 3.

In succession, various modifications of the multilayer substrate in FIG. 3 will be described. FIG. 4 is a cross-sectional view showing a first modification of the multilayer substrate in FIG. 3.

Referring to FIG. 4, in the present modification, the wiring layer 26 routed in the flexible portion 120 is arranged in the turn-back portion 37, at a position closer to an outer peripheral side relative to an inner peripheral side of the flexible portion 120 generally defining the wave-shaped portion.

More specifically, an inner peripheral edge 41 of the turn-back portion 37 is defined at an end portion of the slit 31 extending toward the turn-back portion 37. An outer peripheral edge 42 of the turn-back portion 37 is defined at an end portion of the turn-back portion 37 on the extension 40 from the slit 31 that opposes the inner peripheral edge 41 (see FIG. 2). In this case, the wiring layer 26 is arranged in the turn-back portion 37 such that a length L1 between outer the peripheral edge 42 and the wiring layer 26 is smaller than a length L2 between the inner peripheral edge 41 and the wiring layer 26.

According to such a construction, the wiring layer 26 is arranged on the outer peripheral side, rather than on the inner peripheral side where stress is more likely to concentrate in the turn-back portion 37. Thus, while the wiring layer 26 itself defines and functions as a reinforcement member for the turn-back portion 37, the wiring layer 26 is prevented from being damaged by concentration of stress due to deformation.

Figure 5:
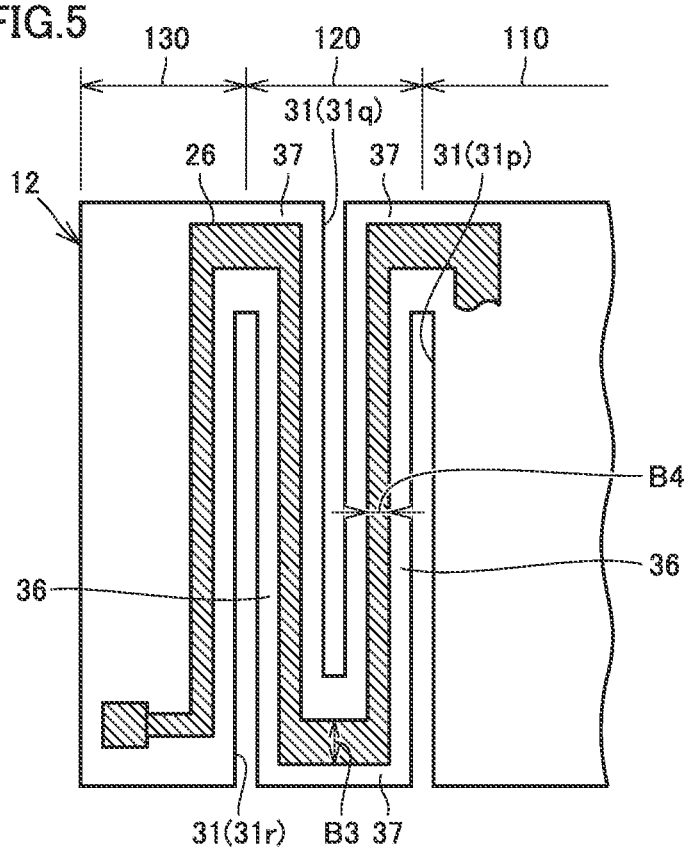
FIG. 5 is a cross-sectional view showing a second modification of the multilayer substrate in FIG. 3.

FIG. 5 is a cross-sectional view showing a second modification of the multilayer substrate in FIG. 3. Referring to FIG. 5, in the present modification as well, as in the multilayer substrate shown in FIG. 4, the wiring layer 26 routed in the flexible portion 120 is arranged in the turn-back portion 37 at a position closer to the outer peripheral side relative to the inner peripheral side of the flexible portion 120 generally defining the wave-shaped portion.

In the present modification, furthermore, the wiring layer 26 is provided such that a cross-sectional area thereof in the turn-back portion 37 is greater than a cross-sectional area thereof in the intermediate portion 36. The wiring layer 26 is provided such that a width B3 thereof in the turn-back portion is greater than a width B4 thereof in the intermediate portion 36 (B3>B4).

According to such a construction, since a cross-sectional area of the wiring layer 26 in the turn-back portion where stress tends to concentrate with deformation of the flexible portion 120 is greater than a cross-sectional area thereof in the intermediate portion 36, the wiring layer 26 is more reliably prevented from being damaged by concentration of stress due to deformation.

The structures of the wiring layer 26 shown in FIGS. 3 to 5 may be combined as appropriate, and for example, in the wiring layer 26 shown in FIG. 3, a cross-sectional area of the wiring layer 26 in the turn-back portion 37 may be greater than a cross-sectional area of the wiring layer 26 in the intermediate portion 36.

The structure of the multilayer substrate in the first preferred embodiment of the present invention described above will be summarized. The multilayer substrate 10 in the present preferred embodiment includes the multilayer body 12 including a plurality of stacked resin layers 21 and the wiring layer 26 provided in the resin layer 21. The multilayer body 12 is provided with the deformable flexible portion 120 generally defining a wave-shaped portion and extending along a direction of travel that is repeatedly varied when viewed in the direction of stacking of resin layers 21, the wiring layer 26 being routed along the wave-shaped portion. The flexible portion 120 includes the turn-back portion 37 arranged at a position where the direction of travel is changed and the intermediate portion 36 connects the adjacent turn-back portions 37 to each other. The width B1 of the turn-back portion 37 is greater than the width B2 of the intermediate portion 36.

According to the multilayer substrate 10 in the first preferred embodiment of the present invention thus constructed, with increase in durability of the flexible portion 120, breakage of the flexible portion 120 or breakage of the wiring layer 26 is prevented. Consequently, deterioration of electrical characteristics of electric appliances on which the multilayer substrate 10 is mounted is prevented and reliability thereof is greatly improved. In addition, with an increase in durability of the flexible portion 120, a degree of freedom in mounting of the multilayer substrate 10 on various electric appliances is significantly improved.

Second Preferred Embodiment

Figure 6:
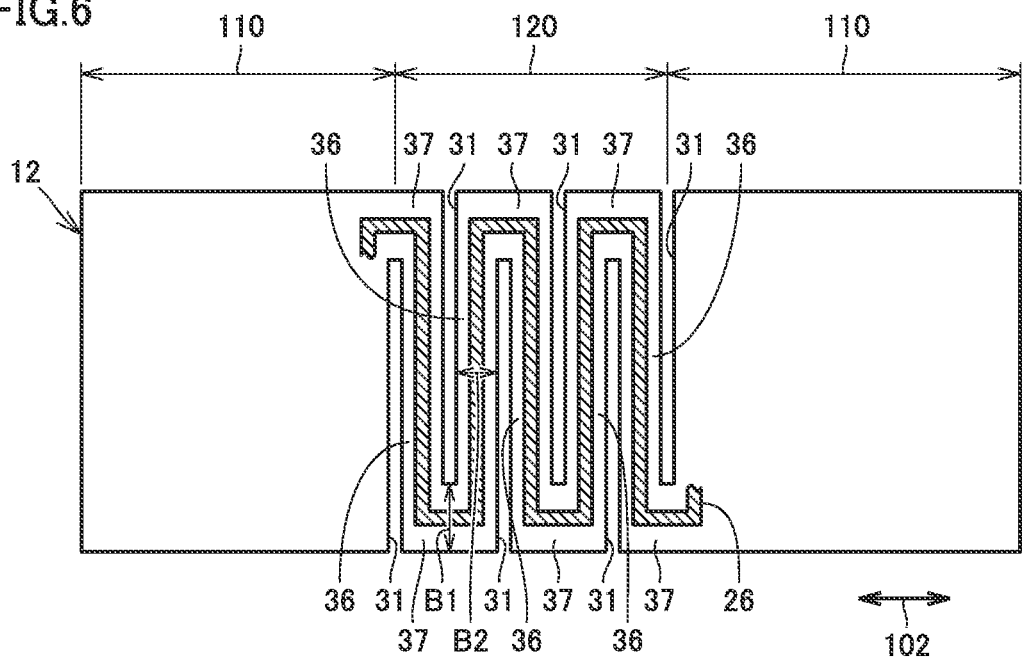
FIG. 6 is a cross-sectional view showing a multilayer substrate in a second preferred embodiment of the present invention.

FIG. 6 is a cross-sectional view showing a multilayer substrate according to a second preferred embodiment of the present invention. FIG. 6 shows a position in cross-section of a multilayer substrate corresponding to FIG. 2 in the first preferred embodiment. A multilayer substrate in the present preferred embodiment is basically the same in structure as the multilayer substrate 10 in the first preferred embodiment. Description of a redundant structure will not be repeated below.

Referring to FIG. 6, in the multilayer substrate in the present preferred embodiment, the multilayer body 12 is provided with the main body portion 110 and the flexible portion 120. The main body portion 110 is provided on each of opposing sides of the flexible portion 120. The flexible portion 120 is the same in structure as that in the multilayer substrate 10 in the first preferred embodiment and generally defines a meandering shape. The flexible portion 120 is configured such that the width B1 of the turn-back portion 37 is greater than the width B2 of the intermediate portion 36 (B1>B2).

FIG. 7 is a cross-sectional view showing a first modification of the multilayer substrate in FIG. 6. Referring to FIG. 7, in a multilayer substrate in the present modification, the flexible portion 120 is provided in a form as in the multilayer substrate in FIG. 4 in the first preferred embodiment.

Namely, the wiring layer 26 routed in the flexible portion 120 is arranged in the turn-back portion 37 at a position closer to the outer peripheral side relative to the inner peripheral side of the flexible portion 120 generally defining the wave-shaped portion. The wiring layer 26 is arranged in the turn-back portion 37 such that the length L1 between the outer peripheral edge 42 and the wiring layer 26 is smaller than the length L2 between the inner peripheral edge 41 and the wiring layer 26 (L1<L2).

FIG. 8 is a cross-sectional view showing a second modification of the multilayer substrate in FIG. 6. Referring to FIG. 8, in a multilayer substrate in the present modification, the flexible portion 120 is provided in a form the same as in the multilayer substrate in FIG. 5 in the first preferred embodiment.

Namely, the wiring layer 26 routed in the flexible portion 120 is arranged in the turn-back portion 37 at a position closer to the outer peripheral side relative to the inner peripheral side of the flexible portion 120 generally defining the wave-shaped portion. The wiring layer 26 is provided such that a cross-sectional area thereof in the turn-back portion 37 is greater than a cross-sectional area thereof in the intermediate portion 36. The wiring layer 26 is provided such that the width B3 thereof in the turn-back portion 37 is greater than the width B4 thereof in the intermediate portion 36 (B3>B4).

According to the multilayer substrate in the second preferred embodiment of the present invention thus constructed, an effect described in the first preferred embodiment is similarly achieved.

Third Preferred Embodiment

Figure 9:
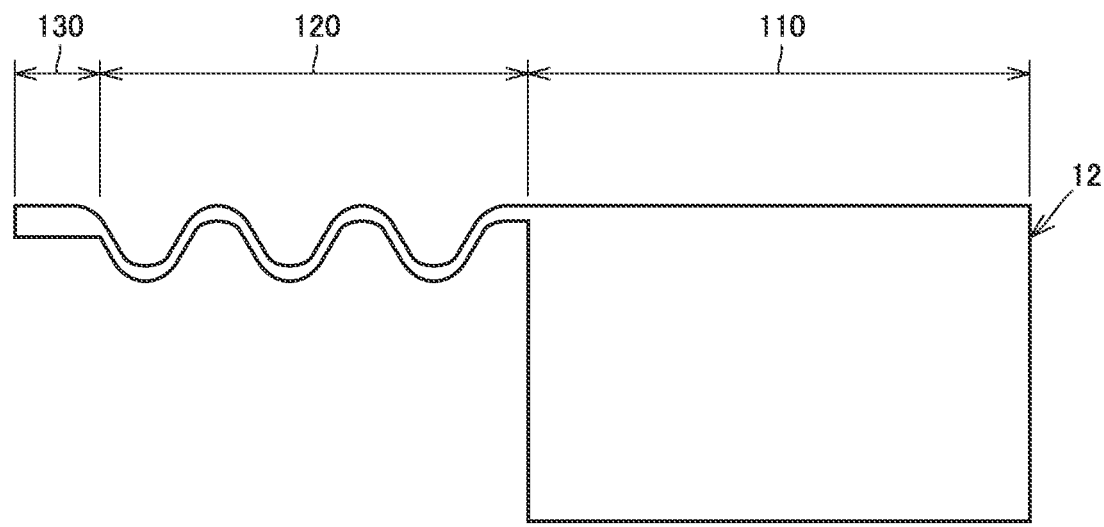
FIG. 9 is a plan view showing a multilayer substrate in a third preferred embodiment of the present invention.

FIG. 9 is a plan view showing a multilayer substrate according to a third preferred embodiment of the present invention. A multilayer substrate in the present preferred embodiment is basically the same in structure as the multilayer substrate 10 in the first preferred embodiment. Description of a redundant structure will not be repeated below.

Referring to FIG. 9, in the multilayer substrate in the present preferred embodiment, the multilayer body 12 is provided with the main body portion 110, the flexible portion 120, and the pad portion 130. The flexible portion 120 extends linearly from the peripheral edge of the main body portion 110. The pad portion 130 is provided at the tip end of the flexible portion 120 extending from the main body portion 110.

Though the figure shows a structure such that the flexible portion 120 extends from one portion in the main body portion 110, the structure may be such that the flexible portions 120 extend from a plurality of portions in the main body portion 110.

Figure 10:
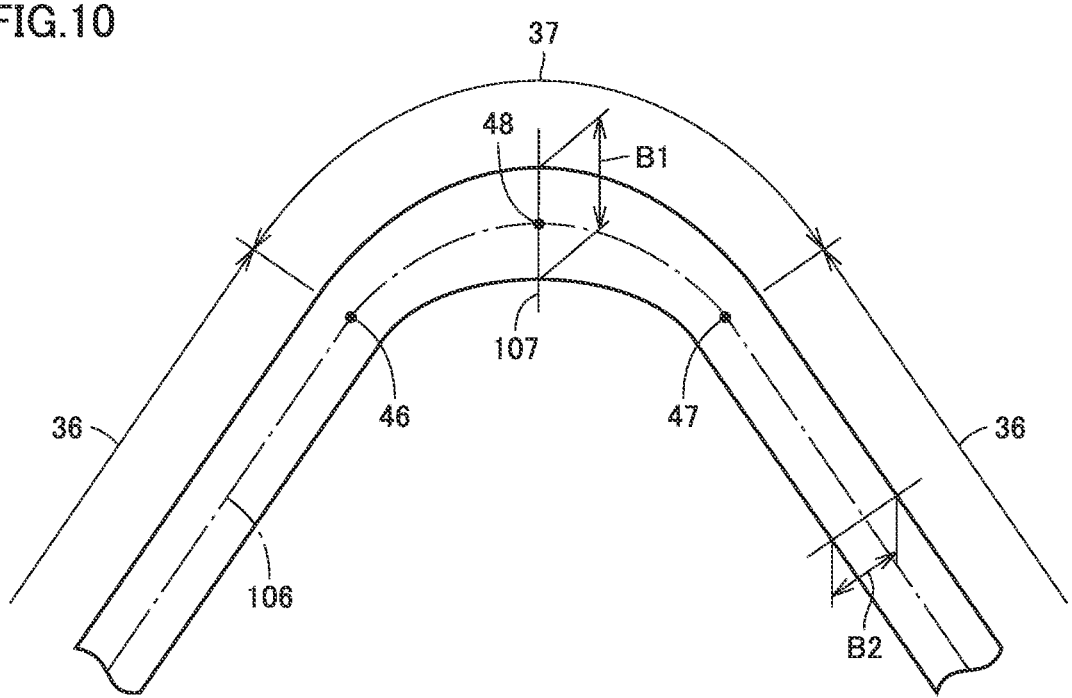
FIG. 10 is a plan view showing a flexible portion in FIG. 9 in an enlarged manner.

FIG. 10 is a plan view showing the flexible portion in FIG. 9 in an enlarged manner. Referring to FIGS. 9 and 10, the flexible portion 120 generally defines a wave-shaped portion extending along direction of travel that is repeatedly changed when viewed in the direction of stacking of the resin layers 21. The flexible portion 120 preferably includes the turn-back portion 37 arranged at a position where the direction of travel is changed and the intermediate portion 36 connecting adjacent turn-back portions 37 to each other.

In the present preferred embodiment, the flexible portion 120 includes the curving turn-back portion 37 and the linearly extending intermediate portion 36 which are alternately combined with each other. The centerline 106 of the flexible portion 120 extending along its direction of travel has a wave shape such that it curves in the turn-back portion 37 and linearly extends in the intermediate portion 36.

In the multilayer substrate in the present preferred embodiment, the flexible portion 120 is configured such that the width B1 of the turn-back portion 37 is greater than the width B2 of the intermediate portion 36.

More specifically, the width B1 of turn-back portion 37 in the direction perpendicular or substantially perpendicular to the centerline 106 at a position 48 of the antinode of the centerline 106 defining the wave-shaped portion is greater than the width B2 of the intermediate portion 36 in the direction perpendicular or substantially perpendicular to the centerline 106. The "antinode" of centerline 106 refers to a portion where the centerline 106 having a wave shape such that a curve in the turn-back portion 37 and a straight line in the intermediate portion 36 are combined with each other has a peak shape in a direction of amplitude thereof.

When the centerline 106 is in symmetry in the area shown in FIG. 10, a straight line 107 which passes through the position 48 of the antinode of the centerline 106 and is perpendicular or substantially perpendicular to the centerline 106 coincides with a perpendicular bisector from a boundary point 46 and a boundary point 47 between the turn-back portion 37 and the intermediate portions 36 on opposing sides thereof.

Figure 11:
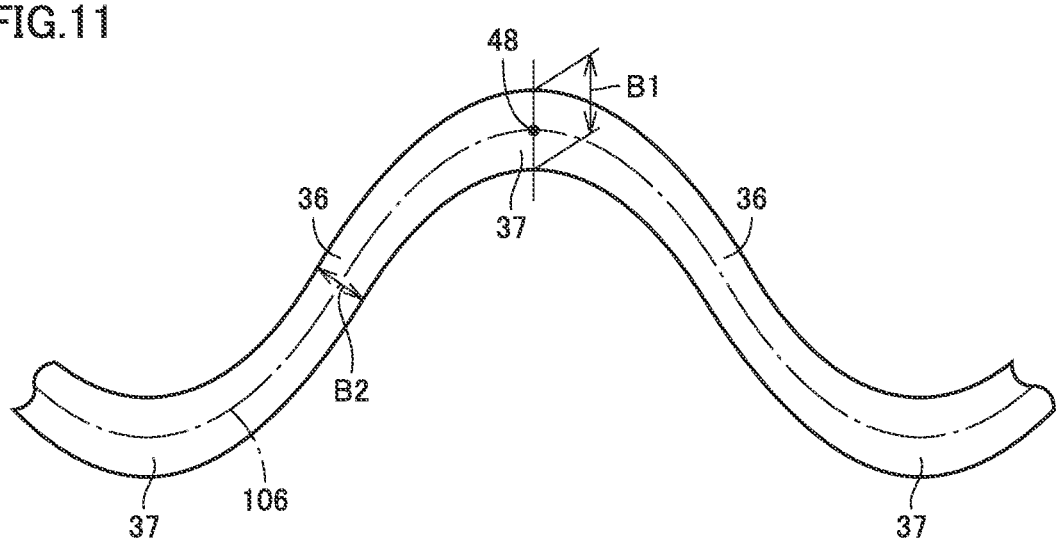
FIG. 11 is a plan view showing a modification of the flexible portion in FIG. 10.

FIG. 11 is a plan view showing a modification of the flexible portion in FIG. 10. Referring to FIG. 11, in the present modification, the flexible portion 120 defines a wave-shaped portion generally extending in a curved configuration. The centerline 106 of the flexible portion 120 extending along its direction of travel has a wave shape extending and curving in the turn-back portion 37 and extending and curving in the intermediate portion 36.

In the multilayer substrate in the present modification, the flexible portion 120 is configured such that the width B1 of the turn-back portion 37 is greater than the width B2 of the intermediate portion 36.

More specifically, the width B1 of the turn-back portion 37 in the direction perpendicular or substantially perpendicular to the centerline 106 at the position 48 of the antinode of the centerline 106 defining the wave-shaped portion is greater than the width B2 of the intermediate portion 36 in the direction perpendicular or substantially perpendicular to the centerline 106. The "antinode" of the centerline 106 refers to a portion where the centerline 106 having a wave-shaped portion such that the curve in the turn-back portion 37 and the curve in the intermediate portion 36 are combined with each other has a peak shape in the direction of amplitude thereof.

According to the multilayer substrate of the third preferred embodiment of the present invention thus constructed, the advantageous effects described in the first preferred embodiment are similarly be achieved.

Preferred embodiments of the present invention are applicable to a multilayer substrate having flexibility (being flexible).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate, comprising:
a multilayer body including a plurality of stacked resin layers and a wiring layer; wherein
the multilayer body includes a deformable flexible portion defining a wave-shaped portion extending in a direction of travel that is repeatedly changed when viewed in a plan view of the resin layers, the wiring layer extending along the wave-shaped portion;
the flexible portion includes turn-back portions arranged at positions where the direction of travel is changed and an intermediate portion connecting adjacent ones of the turn-back portions to each other;
each of the turn-back portions is greater in width than the intermediate portion;
the flexible portion extends in the direction of travel that is repeatedly changed by 180° so as to define a meandering or substantially meandering shape;
a plurality of slits are provided in the multilayer body and pass through in the plan view of the resin layers and extend toward the turn-back portions along the direction of travel of the intermediate portion when viewed in the plan view of the resin layers;
when an inner peripheral edge of the turn-back portions is defined at an end portion of the slit extending toward the turn-back portions and an outer peripheral edge of the turn-back portions is defined at an end portion of the turn-back portions opposing the inner peripheral edge of the turn-back portions, the wiring layer is arranged such that a distance between the outer peripheral edge and a centerline of the wiring layer is smaller than a distance between the inner peripheral edge and the centerline of the wiring layer in the turn-back portions;
the centerline of the wiring layer extending along the direction of travel of the flexible portion has a rectangular or substantially rectangular wave shape;
the wiring layer is rectangular or substantially rectangular wave-shaped;
a cross-sectional area of the wiring layer in at least one of the turn-back portions is greater than a cross-sectional area of the wiring layer in the intermediate portion;
a width of the wiring layer in at least one of the turn-back portions is greater than a width of the wiring layer in the intermediate portion; and
the turn-back portions include only the wiring layer with the centerline arranged at the position where the distance between the outer peripheral edge and the centerline of the wiring layer is smaller than the distance between the inner peripheral edge and the centerline of the wiring layer in the turn-back portions.

2. The multilayer substrate according to claim 1, wherein the wiring layer is arranged in at least one of the turn-back portions, at a position closer to an outer peripheral side relative to an inner peripheral side of the flexible portion.

3. The multilayer substrate according to claim 1, wherein a centerline of the flexible portion extending along the direction of travel has a wave shape such that an antinode is located in at least one of the turn-back portions; and a length of the turn-back portions in a direction perpendicular or substantially perpendicular to the centerline in the antinode is greater than a length of the intermediate portion in the direction perpendicular or substantially perpendicular to the centerline.

4. The multilayer substrate according to claim 1, wherein the wiring layer is a first wiring layer is arranged between the plurality of resin layers.

5. The multilayer substrate according to claim 4, further comprising a plurality of additional wiring layers each located between adjacent ones of the plurality of resin layers.

6. The multilayer substrate according to claim 5, further comprising inner vias arranged to connect the first wiring layer and the plurality of additional wiring layers to each other.

7. The multilayer substrate according to claim 1, wherein the flexible portion includes less of the plurality of resin layers than that of a main body portion of the multilayer body.

8. The multilayer substrate according to claim 1, further comprising a plurality of the flexible portions extending from a plurality of portions of a main body portion of the multilayer body.

* * * * *